United States Patent
Dove et al.

(10) Patent No.: US 6,255,730 B1
(45) Date of Patent: Jul. 3, 2001

(54) INTEGRATED LOW COST THICK FILM RF MODULE

(75) Inventors: Lewis R Dove, Monument; John F Casey; Anthony R Blume, both of Colorado Springs, all of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/302,395

(22) Filed: Apr. 30, 1999

(51) Int. Cl.[7] .................................................. H01L 23/34
(52) U.S. Cl. .................. 257/728; 257/664; 257/691; 257/704; 257/688; 257/731; 257/730
(58) Field of Search .................................. 257/728, 664, 257/691, 704, 688, 731, 730

(56) References Cited

U.S. PATENT DOCUMENTS 4,925,024 * 5/1990 Ellengerger et al. ................ 208/328
5,355,102 * 10/1994 Kornrumpf et al. .................... 333/33
5,639,989 * 6/1997 Higgins ............................ 174/35 MS

* cited by examiner

Primary Examiner—Tom Thomas
Assistant Examiner—Luan Thai
(74) Attorney, Agent, or Firm—Patrick J. Murphy

(57) ABSTRACT

An integrated low cost thick film RF module and method for making same. An improved thick film dielectric is employed to build three-dimensional, high frequency structures. This new dielectric can be utilized to create novel RF and microwave modules that inexpensively integrate the I/O and electrical isolation functions of traditional microcircuits without using the usual set of expensive components. In particular, the module comprises a substrate; a conductive ground plane disposed above the substrate; a first dielectric layer printed on top of the ground plane; a microstrip disposed on top of the first dielectric; a second dielectric layer printed on top of the microstrip; a top ground plane disposed on top of the second dielectric; and a shield, electrically coupled to the top ground plane.

3 Claims, 3 Drawing Sheets

INTEGRATED LOW COST THICK FILM RF MODULE

FIELD OF THE INVENTION

The present invention relates generally to the field of microwave circuits, and more particularly to an integrated thick film RF and microwave microcircuit module.

BACKGROUND OF THE INVENTION

Microwaves are electromagnetic energy waves with very short wavelengths, typically ranging from a millimeter to 30 centimeters peak to peak. In high-speed communications systems, microwaves are used as carrier signals for sending information from point A to point B. Information carried by microwaves is transmitted, received and processed by microwave circuits.

Packaging of RF and microwave microcircuits has traditionally been very expensive. The packaging requirements are extremely demanding—very high electrical isolation and excellent signal integrity through gigahertz frequencies are required. Additionally, IC power densities can be very high. Microwave circuits require high frequency electrical isolation between circuit components and between the circuit itself and the "outside" world (i.e., off the microwave circuit). Traditionally, this isolation was provided building the circuit on a substrate, placing the circuit inside a metal cavity, and then covering the metal cavity with a metal plate. The metal cavity itself is typically formed by machining metal plates and connecting multiple plates together with solder or an epoxy. The plates can also be cast, which is a cheaper alternative to machined plates. However, one sacrifices accuracy with casting.

One problem attendant with the more traditional method of building microwave circuits is that the method of sealing the metal cover to the cavity uses conductive epoxy. While the epoxy provides a good seal, it comes with a price-high resistance, which increases the loss of resonant cavities and leakage in shielded cavities. Another problem with the traditional method is the fact that significant assembly time is required, thereby increasing manufacture costs.

Moving the microwave signals from point A to point B on the microwave circuit is generally accomplished with transmission lines and waveguides. Transmission lines include coaxial, coplanar and microstrip transmission lines. Waveguides, on the other hand, are typically hollow and offer better performance than transmission lines. Another component often found on a microwave circuit is the resonant cavity. Resonant cavities are used to build microwave filters. These cavities are formed when a dielectric region is completely surrounded by conductive walls.

Waveguide structures and resonant cavities are also formed via machining or casting metal parts. As would be expected, this adds to the cost of the final product.

Another traditional approach to packaging RF/microwave microcircuits has been to attach GaAs or bipolar integrated circuits and passive components to thin film circuits. These circuits are then packaged in the metal cavities discussed above. Direct current feedthrough connectors and RF connectors are then used to connect the module to the outside world.

One method for fabricating an improved RF microwave circuit is to employ a single-layer thick film technology in place of the thin film circuits. While some costs are slightly reduced, the overall costs remain high due to the metallic enclosure and its connectors. Also, dielectric materials typically employed (e.g., pastes or tapes) in this type of configuration are electrically lossy, especially at gigahertz frequencies. The dielectric constant is poorly controlled at both any specific frequency and as a function of frequency. Also, controlling the thickness of the dielectric material often proves difficult.

Another method for fabricating an improved RF microwave circuit is described in *Imbedded Waveguide Structures for a Microwave Circuit Package,* Ser. No. 08/882460, filed on Jun. 5, 1997, by Ron Barnett et al., which is incorporated by reference herein for all that it teaches. Barnett teaches a method for fabricating imbedded low-loss waveguide structures in microwave packages via an indented cavity formed in the bottom plane of a metal cover plate. The bottom plane of the cover plate is then fused to a metal base plate. An imbedded shielded cavity is formed when the cover plate and the base plate are joined.

SUMMARY OF THE INVENTION

The present invention provides an integrated low cost thick film RF and microwave microcircuit module. Using an improved thick film dielectric, inexpensive, three-dimensional structures are fabricated on top of a conductive ground plane which is applied to a base substrate. The ground plane forms the bottom electrical shield for the module. A bottom layer of dielectric can be employed to form both microstrip elements and the bottom dielectric for stripline elements. Using an etchable thick film Au process, very small and tightly controlled geometries can be patterned.

DETAILED DESCRIPTION OF THE PREFERRED EMBODIMENT

Figure 1:
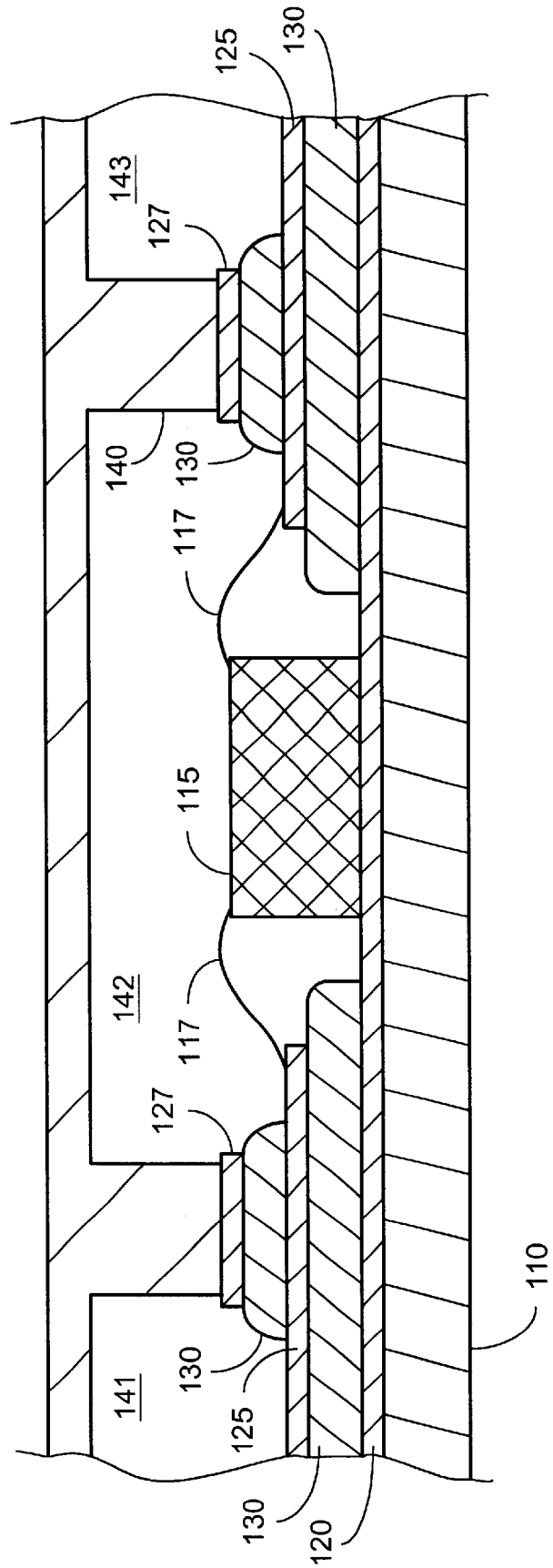
FIG. 1 shows a cross-sectional view of the thick film RF module according to the present invention.

Briefly, an integrated low cost thick film RF module and method for making same is presented. An improved thick film dielectric is employed to build three-dimensional, high frequency structures. The dielectrics (KQ-120 and KQ-CL907406) are available from Heraeus Cermalloy, 24 Union Hill Road, West Conshohocken, Pa. This new dielectric can be utilized to create novel RF and microwave modules that inexpensively integrate the I/O and electrical isolation functions of traditional microcircuits without using the usual set of expensive components.

The thick film dielectric is used to build three-dimensional structures on top of a conductive ground plane which is applied to a base substrate, the substrate can be 96% Alumina for example. The ground plane forms the bottom electrical shield for the module. A bottom layer of dielectric is used to form both microstrip elements, and the bottom dielectric for stripline elements. Using an etchable thick film Au process, such as the Heraeus KQ-500, it becomes possible to pattern very small and tightly controlled geometries for high frequency structures such as microstrips, striplines, filters and couplers. Next, a top layer of dielectric, having a conductor disposed above it, can be used to complete the fabrication of stripline structures. This is a feature of the present invention—using this technique, multistage modules having cavities formed in the dielectric and being connected only by striplines are possible for low cost while improving reliability and electrical isolation.

A top metallic shield cover is then attached to the bottom ground plane using a highly conductive adhesive or other conductive bonding technique (e.g., solder). The shield cover may have multiple cavities to accommodate circuitry in various stages. The shield cover, together with the multiple cavities, can be inexpensively produced by a variety of means, including but not limited to, machining, etching or stamping. The shield cover provides electrical isolation from the outside world, in addition to providing isolation between the various stages of the module. The isolation between the stages is effective because the cavities are nearly completely surrounded by the shield cover as it pinches around each cavity. The only connection between the cavities is made by a stripline transmission line.

Since the cavities can be fabricated quite small, along with the width and height of the stripline interconnections, these structures behave as waveguides with very high low frequency cutoffs, in the order of 100 gigahertz for example. Thus, the frequencies of interest for typical high frequency RF applications are below cut-off and energy carried between cavities is carried only by the striplines. Within each cavity, energy propagates along microstrip structures and then through wire bonds or flip-chip bumps to active devices.

Bias circuitry for active devices can also be brought to each cavity through striplines. Cavities can also be opened in the bottom dielectric layer in order to attach active devices directly to the ground plane, offering better heat sinking for high power devices (versus attaching them to the dielectric as is common). Attachment can be achieved using epoxy, an eutectic solder or flip-chip. For stages that have microstrip structures, the cavities would be created by making an opening in the top dielectric only.

In the striplines, thick film resistor pastes can be printed over the top dielectric layer just underneath the top ground plane and on either side of the stripline center conductor. These resistor pastes can then be shorted to the grounds on either side of the structure. The lossy resistor material helps break up undesired electromagnetic cavity modes and minimize the chance of those modes propagating through the entire structure. Specific frequencies of concern can be further attenuated by making the width of the stripline's top dielectric layer a quarter wavelength narrower than the width of the lower dielectric on either side of the center conductor. The result—a high impedance at the specific frequency inhibiting the formation of cavity modes.

Connections to the outside world can be made to waveguides using a simple opening in the shield cover and a properly designed waveguide transition. A lead frame can be used to make the module surface-mountable. Also, connectors can be used to connect to a mother board or coaxial cables.

FIG. 1 shows a cross-sectional view of the thick film RF module according to the present invention. A conductive ground plane 120 is applied to a substrate 110. A first dielectric layer 130 is printed on top of the ground plane 120 in a conventional manner. In a preferred embodiment, the dielectric 130 is either KQ-120 or KQ-CL907406 dielectric, available from Heraeus Cermalloy.

A microstrip 125 is disposed above the first dielectric 130; a second dielectric layer 130 is then disposed above the microstrip 125 before a top ground plane 127, preferably made of gold is printed on the second dielectric 130. A shield 140 or lid is electrically coupled to the top ground plane 127. As illustrated in FIG. 1, the shield has at least three cavities 141, 142 and 143 machined in it to provide for at least three stages in the microcircuit. The number of cavities can differ without departing from the scope of the present invention.

Disposed within cavity 142 is an integrated circuit (IC) 115 which is electrically coupled to the microstrip 125 via wire bonds 117. The IC 115 is electrically isolated from the stage in cavity 141 and the stage in cavity 143 (neither shown).

Figure 2:
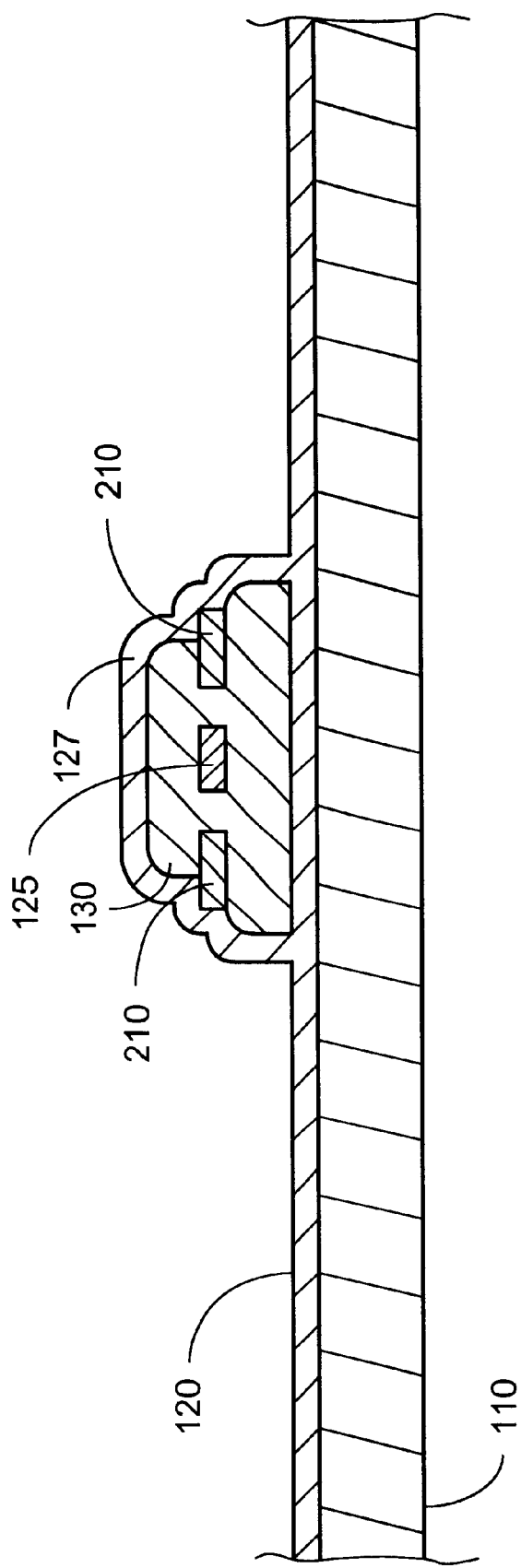
FIG. 2 shows a cross-sectional view of a microstrip structure according to the present invention.

FIG. 2 shows a cross-section view of the microstrip 125 according to the present invention. As illustrated, the conductive ground plane 120, 127 completely encapsulates the microstrip 125. Further illustrated is the fact that the first and second dielectric layers 130 also encapsulate microstrip 125. In a preferred embodiment, resistor pastes 210 are printed on top of the first dielectric layer 130 and on either side of the microstrip 125; this provides further isolation and minimizes the chance of cavity modes propagating through the microcircuit.

Figure 3:
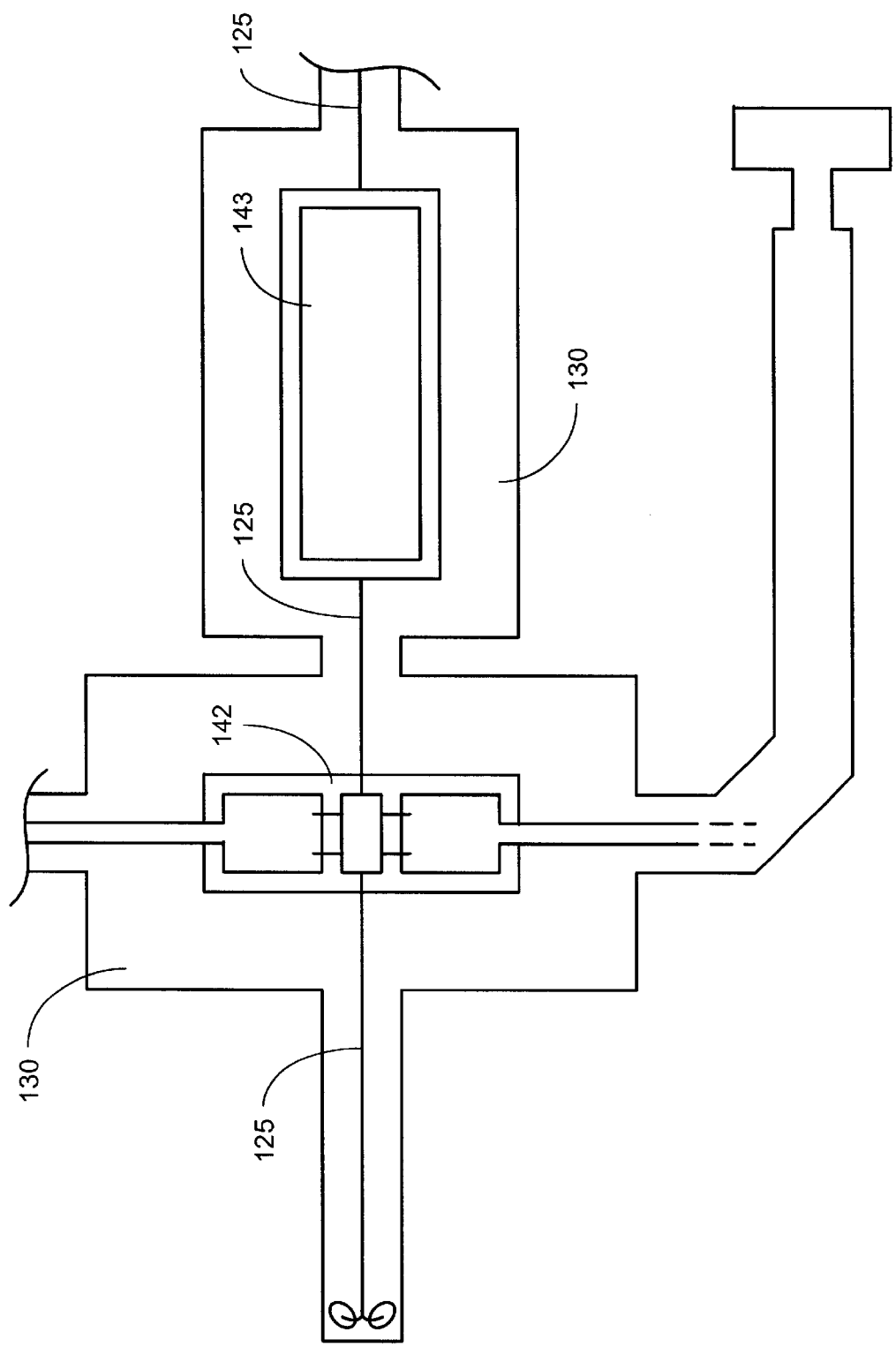
FIG. 3 shows a top view of a portion of an integrated low cost thick film RF/microwave module.

FIG. 3 shows a top view of a portion of an integrated thick film RF module. Cavity 142 contains an IC and power pads which are connected to the IC via wire bonds; cavity 143 contains, for example, a microstrip structure such as a filter or coupler. As illustrated, stripline 125 interconnects cavity 142 with cavity 143, and beyond.

While the present invention has been illustrated and described in connection with the preferred embodiment, it is not to be limited to the particular structure shown. It should be understood by those skilled in the art that various changes and modifications may be made within the purview of the appended claims without departing from the spirit and scope of the invention in its broader aspects.

What is claimed is:

1. An integrated thick film RF microcircuit module comprising:

a substrate;

a conductive ground plane disposed above the substrate;

a first dielectric layer printed on top of the conductive ground plane;

a microstrip disposed on top of the first dielectric layer;

a second dielectric layer printed on top of the microstrip;

a top ground plane disposed on top of the second dielectric layer; and a shield electrically coupled to the top ground plane, wherein the conductive ground plane, the first dielectric layer, the second dielectric layer, the top ground planes and the shield engage each other so as to form a first cavity and a second cavity spaced therefrom, and wherein the microstrip enables electrical communication between the first cavity and the second cavity.

2. The module of claim 1, wherein the top ground plane is electrically coupled to the conductive ground plane, thereby forming an electrically shielded transmission line structure.

3. The module of claim 1, wherein electrical communication between the first cavity and the second cavity is enabled only by the microstrip, and wherein the first cavity and the second cavity are electrically shielded such that the first cavity and the second cavity are electrically isolated from each other except from electrical communication enabled by the microstrip.

* * * * *